(12) United States Patent
Falcon et al.

(10) Patent No.: US 7,912,690 B2
(45) Date of Patent: Mar. 22, 2011

(54) DYNAMIC SAMPLING OF FUNCTIONAL SIMULATION TO DETERMINE WHETHER TO PERFORM BOTH FUNCTIONAL AND TIMING SIMULATION

(75) Inventors: Ayose Falcon, Barcelona (ES); Paolo Faraboschi, Barcelona (ES); Daniel Ortega, Sant Cugat (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 535 days.

(21) Appl. No.: 11/740,269

(22) Filed: Apr. 25, 2007

(65) Prior Publication Data

US 2008/0270952 A1 Oct. 30, 2008

(51) Int. Cl.
G06G 7/62 (2006.01)
G06F 17/50 (2006.01)

(52) U.S. Cl. .......................................................... 703/13
(58) Field of Classification Search ...................... 703/13
See application file for complete search history.

(56) References Cited

U.S. PATENT DOCUMENTS

| | | | | |
|---|---|---|---|---|
| 5,862,149 | A * | 1/1999 | Carpenter et al. | 714/726 |
| 6,622,118 | B1 * | 9/2003 | Crooks et al. | 702/190 |
| 7,246,332 | B2 * | 7/2007 | Likovich et al. | 716/4 |
| 2005/0149313 | A1 * | 7/2005 | Roesner et al. | 703/22 |
| 2008/0040088 | A1 * | 2/2008 | Vankov et al. | 703/13 |
| 2008/0052654 | A1 * | 2/2008 | Rahmat et al. | 716/6 |
| 2008/0126071 | A1 * | 5/2008 | Faraboschi et al. | 703/22 |

OTHER PUBLICATIONS

Ram Srinivasan, Jeanine Cook, Shaun Cooper, "Fast, Accurate Microarchitecture Simulation Using Statistical Phase Detection", IEEE, 2005.*
Ram Srinivasan, "Fast, Accurate Microarchitecture Simulation Using Statistical Phase Detection", IEEE 2005.*
Ram Srinivasan, "Fast, Accurate Microarchitecture Simulation Using Statistical Phase Detection", IEEE 2005.*
T. Austin et al., "SimpleScalar: An infrastructure for computer system modeling," Computer, Feb. 2002.
V. Bala et a., "Dynamo: A transprent dynamic optimization system," Procs. Of 2000 Conf. on Prog'g Lang., Design and Implementation, 2000.
P. Barham et a., "Xen and the art of visuzliation," Procs. of 19th Symp. on OS Principles, Oct. 2003.
R. Bedicheck, "SimNow: Fast platform simulation purely in software," Hot Chips, 2004.
F. Bellard, QEMU, www.qemu.org, 2007.
F. Bellard, "QEMU, a fast and portable dynamic translator," USENIX 2005 Annual Technical Conf., Apr. 2005.
B. Calder, SimPoint, www.cse.ucsd.edu/~calder/simpoint, 2005.
S. Chen, "Direct SMARTS, accelerating microarchitectural simulation through direct execution," Master's Thesis, Elec'l & Comp. Eng'g, Carnegie Mellon Univ., Jun. 2004.
C Hughes et al., "RSIM: Simulation shared-memory multiprocessors with ILP processors," Computer, Feb. 2002.
T. Lafage et al., "Choosing representative slices of program execution for microarchitecture simulations," Workload Characterization of Emerging Comp. Apps, 2001.

(Continued)

Primary Examiner — Hugh Jones
Assistant Examiner — Angel J Calle

(57) ABSTRACT

A method for simulating a system normally performs functional simulation of the system without performing timing simulation of the system. The method dynamically samples the functional simulation of the system at intervals to determine whether the functional simulation has entered into a new phase. Where the functional simulation has entered into a new phase, the method performs both the functional simulation and the timing simulation of the system for one or more intervals.

17 Claims, 4 Drawing Sheets

OTHER PUBLICATIONS

J. Lau et al., "The strong correlation between code signatures and performance," Procs. of Int'l Symp. on Perf. Analysis of Sys. and Software, Mar. 2005.

K. Lawton, Bochs open source IA-32 emulation project, http://bochs.sourceforge.net, accessed from Internet 2007.

P.S. Magnusson et al., "Simics: A full system simulation platform," Computer, Feb. 2002.

M. Rosenblum, VMWare, http://www.vmware.com, copyright 2007.

T. Sherwood et al., "Automatically characterizing large scale program behavior," Procs. of 10th Int'l Conf. on Arch'l Support for Prog'g Langs. and OS, Oct. 2002.

J.L. Henning, "SPEC CPU2000," Computer, Jul. 2000.

M. Van Biesbrouck et al., "Efficient sampling startup for sampled processor simulation," Procs. of Int'l Conf. on High Perf. Embedded Archs. & Compilers, Nov. 2005.

T.F. Wenisch et al., "Turbosmarts: accurate microarchitecture simulation sampling in minutes," SIGMETRICS Perform. Eval. Rev., Jun. 2005.

R.E. Wunderlich et al., "SMARTS: Accelerating microarchitecture simulation via rigorous statistical sampling," Procs. of 30th Annual Int'l Symp. on Comp. Arch., Jun. 2003.

M.T. Yourst, PTLSM user's guide and reference, http://wwwptlsim.org, copyright 2007.

D.M. Tullsen et al., "Simultaneous Multithreading: Maximizing On-ChipParallelism", In 22nd Annual International SymposiumonComputer Architecture, Jun. 1995.

\* cited by examiner

DYNAMIC SAMPLING OF FUNCTIONAL SIMULATION TO DETERMINE WHETHER TO PERFORM BOTH FUNCTIONAL AND TIMING SIMULATION

BACKGROUND

Simulating system execution of applications made up of instructions (viz., processor instructions) is commonly performed. Typically, such simulation is performed to ensure that the system and the applications operate as they are expected or intended to operate. Furthermore, such simulation may be performed to verify that systems, applications, and computer programs that were designed for older, outdated hardware are properly executed using more modern hardware. This type of simulation is known as functional simulation. However, other types of simulation of system execution of instructions are also important.

For instance, another type of simulation simulates how long it will take a system to execute the instructions of a given application. This type of simulation is known as timing simulation. As another example, a type of simulation may simulate how much electrical power the system uses to execute the instructions of a given application. This type of simulation is known as power simulation.

The functional simulation of system execution of instructions is commonly performed much more quickly than performing both the functional simulation and the timing simulation of system execution of instructions. Therefore, the functional simulation alone may be performed more often than both the functional simulation and the timing simulation, due to time constraints. However, also not performing the timing simulation when the functional simulation is performed results in an incomplete simulation, which can be undesirable.

DETAILED DESCRIPTION OF THE DRAWINGS

Figure 1:
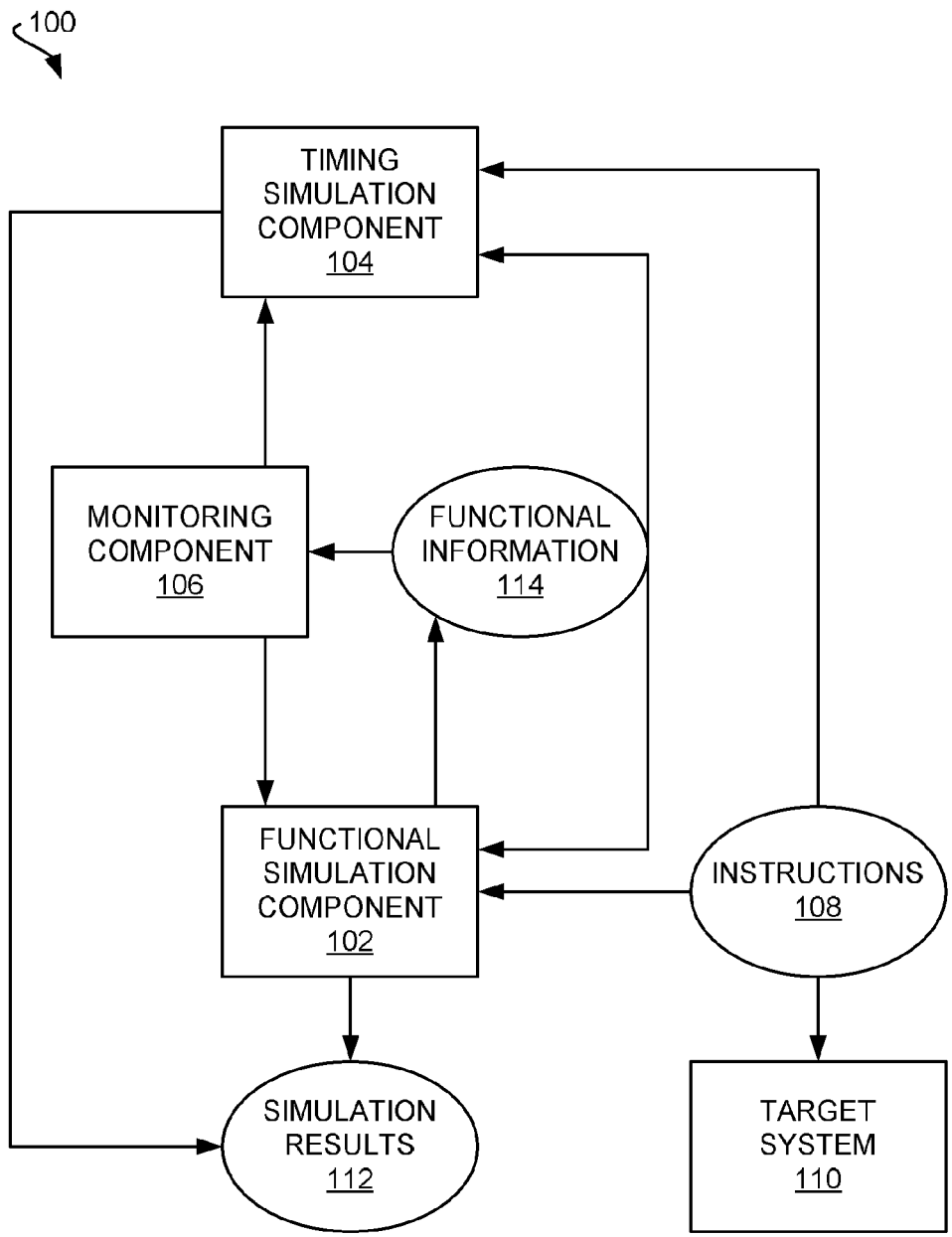
FIG. 1 is a diagram of a system for simulating instructions to be executed on a target system, according to an embodiment of the invention.

FIG. 1 shows a system 100, according to an embodiment of the invention. The system 100 includes at least a functional simulation component 102, a timing simulating component 104, and a monitoring component 106. The system 100 may be implemented within or over one or more computing devices, such as desktop or laptop computers. The simulation components 102 and 104 and the monitoring component 106 may be implemented in hardware, software, or a combination of hardware and software. As can be appreciated by those of ordinary skill within the art, the system 100 may include other components, in addition to the simulation components 102 and 104. As can also be appreciated by those of ordinary skill within the art, the simulation components 102 and 104 can be implemented as is conventional, or in another way.

The functional simulation component 102 simulates functional execution of instructions 108 on a target system 110, whereas the timing simulation component 104 simulates timing execution of the instructions 108 on the target system 110. The instructions 108 may be part of one or more applications to ultimately be executed on the target system 110. The target system 110 itself can be or include one or more computing devices, such as single-processor computer systems, as well as multiple-processor computer systems.

The functional simulation component 102 simulates the functional execution of the instructions 108 on the target system 110, and thus simulates the functional execution of the target system 110, in that the simulation component 102 determines whether the system 110 and the instructions 108 operate as they are expected or intended to operate. That is, the functional simulation component 102 simulates how the target system 110 operates with respect to the instructions 108. The functional simulation component 102 by itself does not provide timing information, such as the time it takes for the target system 110 to execute the instructions 108.

By comparison, the timing simulation component 104 simulates how long, or how much time, the target system 110 takes to execute the instructions 108. That is, the timing simulation component 104 simulates how long, or how much time, the target system 110 takes to perform an intended task. The timing simulation component 104 does not test whether the target system 110 properly or correctly executes the instructions 108, which instead is the domain of the functional simulation component 104.

It is noted that the functional simulation component 102 and the timing simulation component 104 may provide information to one another regarding their respective simulations to enhance simulation accuracy. For instance, the functional simulation component 102 may provide functional simulation information to the timing simulation component 104 to improve the timing simulation. Likewise, the timing simulation component 104 may provide timing simulation information to the functional simulation component 102 to improve the functional simulation.

As can be appreciated by those of ordinary skill within the art, performing timing simulation by the timing simulation component 104 is typically slower than performing functional simulation component 102. That is, if just the functional simulation component 102 is performing functional simulation, such simulation of the target system 110 executing the instructions 108 is performed more quickly than if both the functional simulation component 102 and the timing simulation component 104 are performing their respective simulations of the target system 110 at the same time. In this respect, it may be desirable to not perform timing simulation at all times.

The simulation of the target system 110 executing the instructions 108 can be divided over a number of successive intervals. For example, in one embodiment, each interval may correspond to a number of the instructions 108 being executed, such as one million of the instructions 108. In general, the functional simulation component 102 performs functional simulation of the target system 110 during every interval. By comparison, the timing simulation component 104 performs timing simulation of the target system 110 just during some intervals. This permits both timing simulation and functional simulation to be performed, while still ensuring that these simulations of the target system 110 are performed in a reasonable length of time.

During functional simulation of the target system 110, the functional simulation component 102 outputs functional simulation information 114. The monitoring component 106 monitors the functional simulation information 114 to determine whether the functional simulation component 102 has entered a new phase. A phase of the functional simulation component 102 can in one embodiment correspond to changes in simulating how the target system 110 is executing the instructions 108, due to the instructions 108 resulting in the target system 110 performing differently than in a previous phase. That is, the functional simulation component 102 may functionally simulate the target system 110 in different ways, where when the component 102 switches from simulating the system 110 in one way to another way, it can be said that the functional simulation has entered a new phase. Phases of the functional simulation can further correspond to other changes within the functional simulation of the target system 110 executing the instructions 108, as can be appreciated by those of ordinary skill within the art.

When the monitoring component 106 detects that the functional simulation component 102 has entered a new phase, based on monitoring the functional simulation information 114, it causes the timing simulation component 104 to perform timing simulation of the target system 110 for one or more subsequent intervals. Once this timing simulation has been performed, timing simulation is again not performed until another new phase of the functional simulation has been detected by the monitoring component 106. In effect, then, the timing simulation component 104 performs timing simulation of the target system 110 executing the instructions 108 just at times when the functional simulation has entered a new phase. At other times, the timing simulation component 104 does not perform timing simulation, to enhance performance of the simulation of the target system 110 as a whole.

In this way, the monitoring component 106 dynamically monitors the functional simulation of the target system 110 by the functional simulation component 102. When the monitoring component 106 determines that the functional simulation has entered a new phase, it causes the timing simulation component 104 to perform timing simulation for one or more intervals. The timing simulation performed during these intervals is presumed to be representative of all the intervals for the current phase. Therefore, even though the timing simulation is not performed for all the intervals, the timing simulation that is performed is relatively accurate. The granularity at which the monitoring component 106 concludes that the functional simulation component 102 has entered a new phase can be varied, to provide for more accuracy but lengthier simulation, or to provide for less accuracy but faster simulation.

In one embodiment, the functional simulation information 114 includes values for a number of monitored variables. When one or more of these variables change by more than a predetermined threshold, the monitoring component 106 concludes that the functional simulation of the target system 110 has entered a new phase. Such variables can include the number of cache invalidations within the simulation of the target system 110, the number of translation lookaside buffer (TLB) invalidations within the simulation, the number of input/output (I/O) operations within the simulation, as well as the number of computer program code exceptions within the simulation, among other types of monitored variables. When one or more of these variables change from one interval to the next interval by more than a predetermined threshold, therefore, it is concluded that the functional simulation has entered a new phase.

Once the functional and the timing simulations have been completed, the functional simulation component 102 outputs functional simulation results 112, and the timing simulation component 104 may output timing simulation results 112. These simulation results 112 may then be used by a developer or a designer to ensure that the target system 110 is properly executing the instructions 108, in the proper length of time. Described next in the detailed description is a particular approach by which the functional simulation of the target system 110 is dynamically monitored to determine when the timing simulation of the target system 110 is to be performed.

Figure 2:
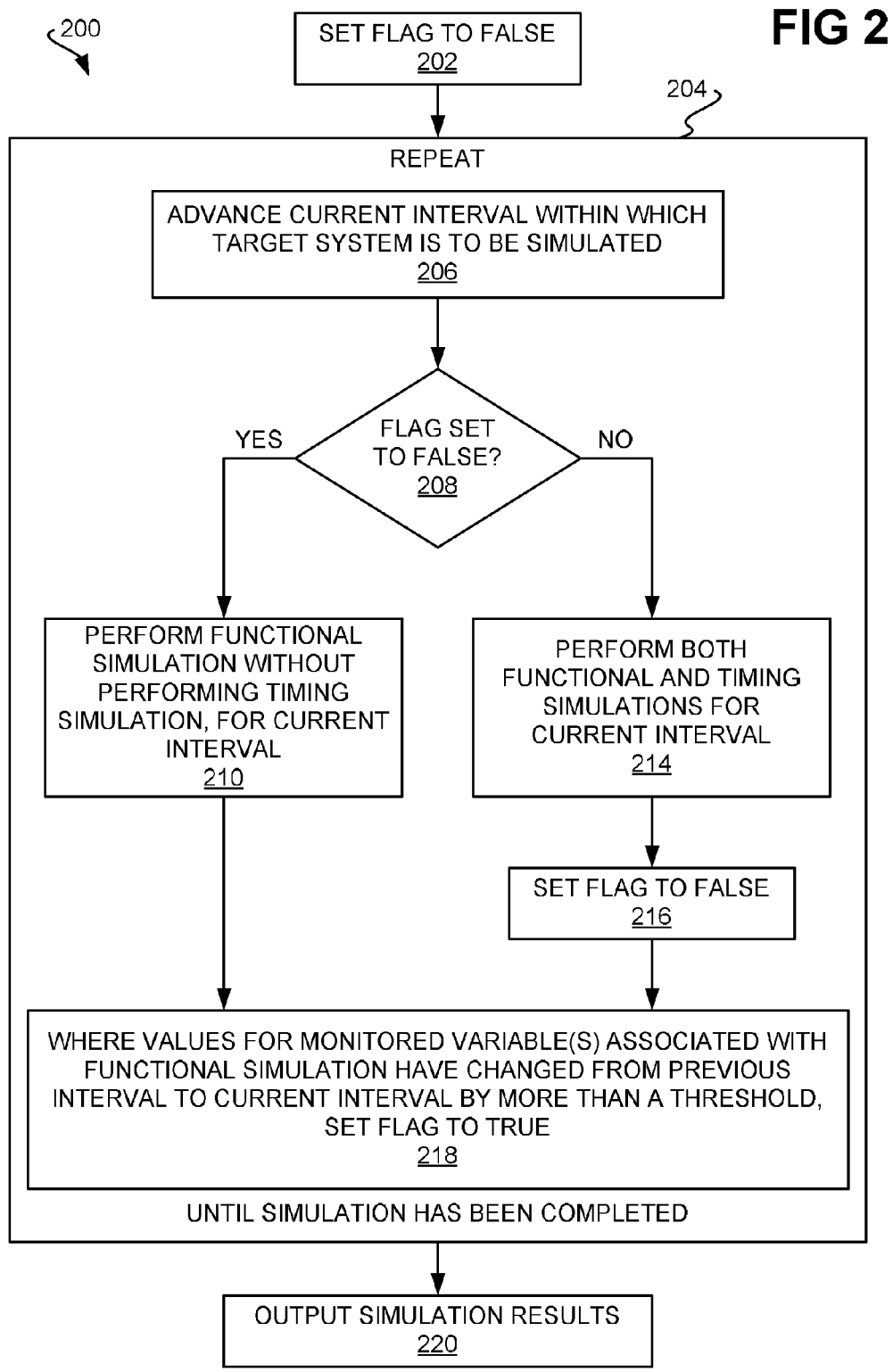
FIG. 2 is flowchart of a method for dynamically monitoring functional simulation of a target system to determine when to perform timing simulation of the target system, according to an embodiment of the invention.

FIG. 2 shows a method 200 for performing functional simulation and timing simulation of a system, where the timing simulation is performed when dynamic monitoring of the functional simulation indicates that the function simulation has entered a new phase, according to an embodiment of the invention. The method 200 is representatively described in relation to the system 100 of FIG. 1. The method 200 is further described in relation to a number of intervals within which the target system 110 is simulated. For instance, these intervals in one embodiment can correspond to a simulation of a number of instructions executed by the processor of the target system 110.

A flag is initially set to false (202). The flag indicates whether just functional simulation of the target system 110 should be performed for a given interval, or whether both functional simulation and timing simulation of the target system 110 should be performed for a given interval. The method 200 repeats the following (204) until the simulation has been completed—that is, until all the intervals within which simulation is performed have been processed.

First, the current interval within which the target system 110 is to be simulated is advanced (206). If this is the first time that part 206 is being performed, then the current interval is advanced to the first interval. If this is not the first time that part 206 is being performed, then the current interval is advanced to the next interval. Next, the method 200 determines whether the flag has been set to false (208).

If the flag has been set to false, then functional simulation of the target system 110 is performed for the current interval without performing timing simulation (210). Such simulation is performed by the functional simulation component 102. By comparison, if the flag has been set to true, then both functional simulation and timing simulation of the target system 110 are performed for the current interval (214), where the functional simulation is performed by the functional simulation component 102, and the timing simulation is performed by the timing simulation component 104. The flag is then set to false (216).

In either case, where the values for one or more monitored variables associated with the functional simulation have changed from a previous interval to a current interval by more than a threshold, the flag is set to true (218). The threshold can be dynamically adjusted so that the relative differences with respect to the monitored variables in the previous intervals are examined. Additionally, when monitoring multiple variables, the variables may be monitored by determining the difference of the vector norm of the variables.

For instance, given a sensitivity threshold S, a new simulation interval can be triggered when $$\sum_{m=0}^{N}\left\|1 - \frac{v_{m,t} - v_{m,t-1}}{v_{m,t-1} - v_{m,t-2}}\right\| >= S \quad (1)$$

In equation (1), N is the number of monitored variables at any instant $t(v_{0,t},\ldots v_{N-1,t})$, and $\|x\|$ is an operator representing the vector norm (i.e., a function that assigns a positive size to all possible values) of the vector of the variables. In one embodiment, a two-dimensional Euclidean norm $\|x\|=x^2$ can be used to implement equation (1), but other norm functions can also be employed. Such dynamic monitoring of the functional simulation is performed by the monitoring component 106, and corresponds to new phases being entered by the functional simulation. It is noted that granularity in determining when a new phase has been entered can be set by increasing or decreasing the threshold. If the threshold is increased, then lesser granularity is achieved, and if the threshold is decreased, then greater granularity is achieved.

The net effect of the method 200 is that functional simulation of the target system 110 is performed during each interval of simulation, while timing simulation of the target system 110 is performed during just some intervals. More particularly, timing simulation of the target system 110 is performed just when the functional simulation enters a new phase. That is, timing simulation of the target system 110 is performed when it is determined that one or more of the monitored variables have changed in value by more than a threshold according to equation (1).

In the case of a multiprocessor (or multithreaded) simulated system, the simulator collects a separate vector of monitored variable for each individual processor core (or thread). In an embodiment where the functional simulation allows individual processors of the system (where the system is a multiprocessor system having multiple processors) or individual threads of the system (where the system is a multithreaded system having multiple threads) to be simulated with timing, whether to enter a new simulation phase is determined independently for each processor or for each thread. As such, each processor or each thread is able to enter a new simulation phase independent of the other processors or threads. In another embodiment, all the processors of the system (where the system is a multiprocessor system having multiple processors) or individual threads of the system (where the system is a multithreaded system having multiple threads) may have to be in the same simulation state during a given simulation interval. As such, all the processors or all the threads enter new simulation phases as a group, and not independently of one another. In this situation, whether to enter a new simulation phase can be determined based on the vector of the monitored variables of any CPU exceeding the sensitivity threshold according to equation (1).

Ultimately, the simulation of the target system 110 is completed, at which time the results of the simulation are output (220). The simulation results may be stored in an electronic file, for instance, for later review and analysis by a developer or designer of the target system 110 or of the application encompassing the instructions 108. The simulation results may further be displayed on a display device, or printed as hardcopy by a printing device.

Figure 3:
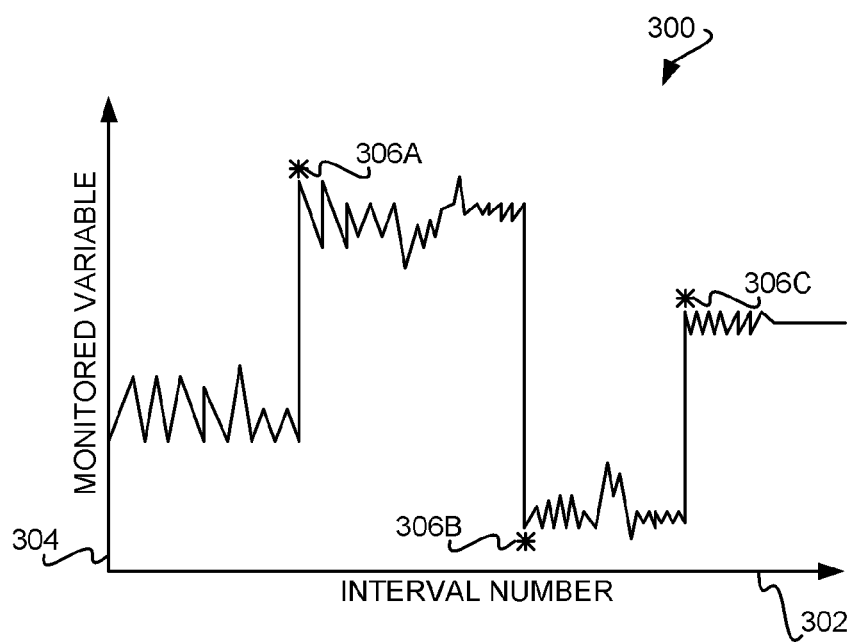
FIG. 3 is a timing diagram depicting how the timing simulation of a target system can be performed when the functional simulation of the target system enters new phases, according to an embodiment of the invention.

FIG. 3 shows a timing diagram 300 illustratively depicting dynamic monitoring of the functional simulation of the target system 110, according to an embodiment of the invention. The x-axis 302 represents simulation interval number, and the y-axis 304 denotes the value of a given monitored variable. Thus, as the simulation of the target system 110 progresses from left to right, the value of the monitored variable changes as indicated in the timing diagram 300.

Demarcated within the timing diagram 300 are a number of points 306A, 306B, and 306C, collectively referred to as the points 306. The points 306 representatively indicate when the value of the monitored variable has changed by more than a threshold. The monitoring component 106 monitors the value of the variable from interval to interval. When the variable's value changes by more than a threshold, at the points 306, it turns on the timing simulation component 104 for one or more subsequent intervals. Thus, at each of the points 306, the timing simulation component 104 performs timing simulation for one or more intervals, and then is turned off again.

The phases of the functional simulation are illustratively depicted between successive points 306. For instance, from the first interval to the point 306A represents a first phase of the functional simulation. A second phase of the functional simulation is represented between the points 306A and 306B, and a third phase is represented between the points 306B and 306C. During a given phase of the functional simulation, the value of the monitored variable does not change by more than a threshold from interval to interval within that phase.

It is noted that the timing information provided for a given phase is weighted according to the length of that phase. As a simple example, there may be two phases, A and B, where 70% of the instructions being simulated are executed within phase A, and the remaining 30% of the instructions being simulated are executed within phase B. The timing information over the entire simulation (i.e., over both phases A and phase B) may not simply be the average of the timing information of phase A and the timing information of phase B. Rather, the timing information over the entire simulation may be 70% of the timing information of phase A plus 30% of the timing information of phase B, as can be appreciated by those of ordinary skill within the art.

Figure 4:
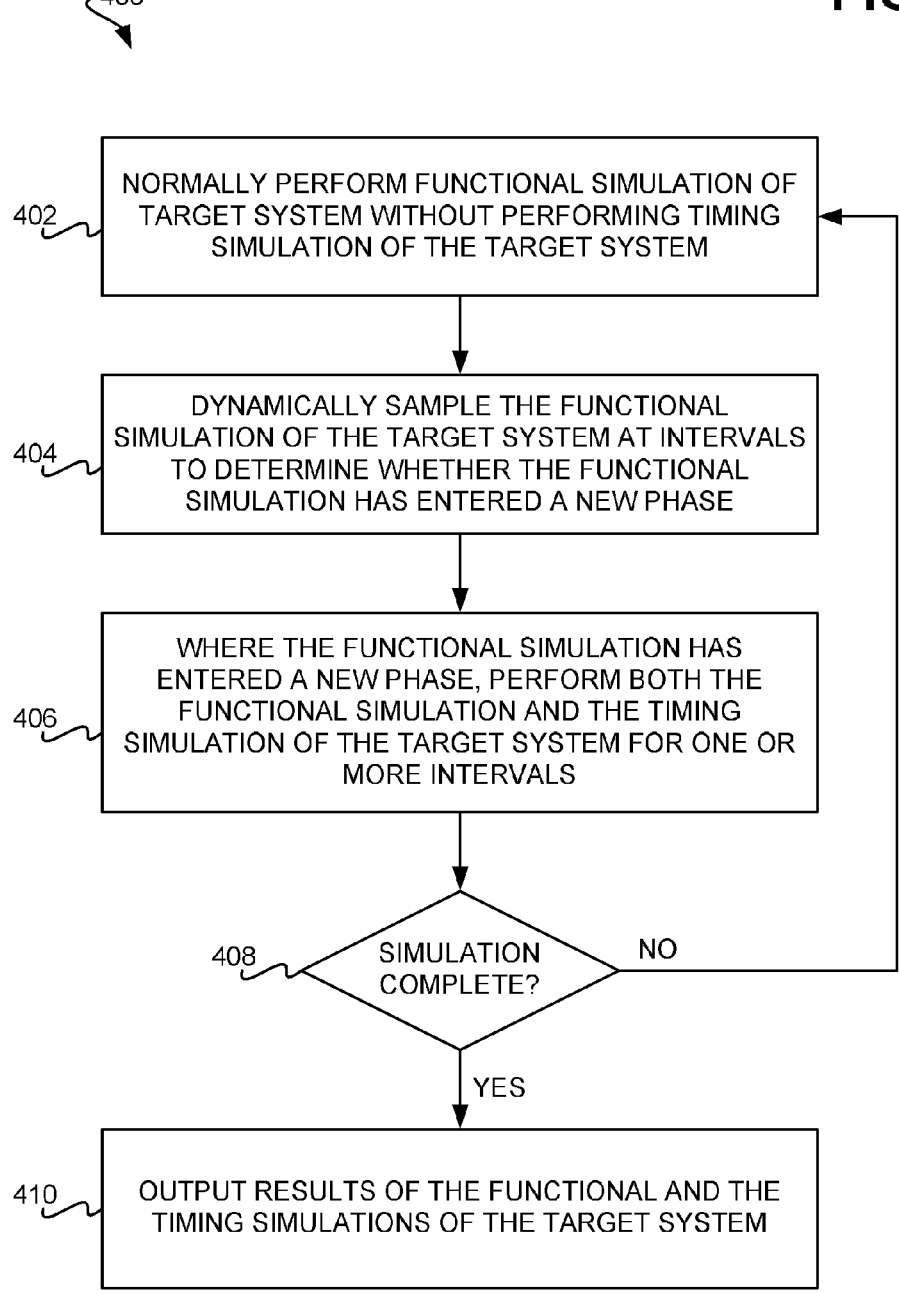
FIG. 4 is a flowchart of a method for dynamically monitoring functional simulation of a target system to determine when to perform timing simulation of the target system, and that is more general than but consistent with the method of FIG. 2, according to an embodiment of the invention.

In conclusion, FIG. 4 shows a method 400 for performing simulation of a target system in which timing simulation is performed when functional simulation has entered a new phase, according to an embodiment of the invention. The method 400 is more general than but consistent with the method 200 of FIG. 2 that has been described. As such, the method 400 may be performed in relation to the system 100 of FIG. 1, although the method 400 is not particularly described in relation to the system 100.

Normally, just functional simulation of a target system is performed (402), without performing timing simulation of the target system. Such functional simulation includes simulating how the target system operates, as has been described, and such functional simulation is typically performed more quickly than performing both functional simulation and timing simulation. Performing the functional simulation includes generating values for one or more monitored variables during such performance, such as during each interval of the simulation. Furthermore, timing simulation simulates how long the target system takes to perform an intended task.

During the functional simulation process, the functional simulation is dynamically sampled to determine whether the functional simulation has entered a new phase (404). For instance, it may be determined whether the values for one or more of the monitored variables have changed by more than a threshold from one interval to the next interval to determine whether the functional simulation has entered a new phase. Such monitored variables can include cache invalidations, TLB invalidations, I/O operations, computer program code exceptions, and other types of monitored variables, as can be appreciated by those of ordinary skill within the art.

Where the functional simulation has entered a new phase, both the functional simulation and the timing simulation of the target system are performed for one or more subsequent intervals (406). For example, in the method 200 that has been described, both functional and timing simulations are performed for one interval after it has been determined that the functional simulation has entered a new phase. Thereafter, presuming that the simulation is not yet complete (408), the method 400 repeats at part 402, where, as before, just functional simulation of the target system is normally performed. Once the simulation is finished, the results of the simulation are output (410), including the results of the timing and/or functional simulation.

We claim:

1. A method for simulating a system, comprising:
normally performing functional simulation of a system without performing timing simulation of the system, by hardware of a computing device;
dynamically sampling the functional simulation of the system at intervals to determine whether the functional simulation has entered into a new phase, by the hardware of the computing device; and,
where the functional simulation has entered into a new phase,
performing both the functional simulation and the timing simulation of the system for one or more intervals, by the hardware of the computing device,
wherein dynamically sampling the functional simulation of the system at the intervals to determine whether the functional simulation has entered into a new phase comprises determining whether a sum of vector norms based on values for a plurality of monitored variables is greater than a threshold,
wherein the sum of vector norms is $$\sum_{m=0}^{N} \left\| 1 - \frac{v_{m,t} - v_{m,t-1}}{v_{m,t-1} - v_{m,t-2}} \right\|,$$

where N is equal to a total number of the monitored variables, and where $v_{m,T}$ refers to the value of a given monitored variable m at time T, where T can be equal to a current time t, a time t-1 immediately prior to the current time t, or a time t-2 immediately prior to the time t-1.

2. The method of claim 1, further comprising outputting results of the functional simulation and the timing simulation of the system.

3. The method of claim 1, further comprising, after performing both the functional simulation and the timing simulation of the system for the one or more intervals, repeating the method at performing the functional simulation of the system without performing the timing simulation of the system for subsequent intervals.

4. The method of claim 1, wherein performing the functional simulation of the system comprises simulating how the system operates.

5. The method of claim 1, wherein performing the functional simulation of the system without performing the timing simulation of the system is performed more quickly than performing both the functional simulation and the timing simulation is performed.

6. The method of claim 1, wherein performing the functional simulation of the system without performing the timing simulation comprises generating the values for the monitored variables while performing the functional simulation.

7. The method of claim 1, wherein each vector norm is a two-dimensional Euclidean norm.

8. The method of claim 1, wherein each vector norm is based on the value of a corresponding monitored variable at a current time, the value of the corresponding monitored variable at a first time immediately prior to the current time, and the value of the corresponding monitored variable at a second time immediately prior to the first time.

9. The method of claim 1, wherein the system is a multi-processor system having a plurality of processors or a multi-threaded system having a plurality of threads, the monitored variables are collected for each processor or for each thread, and the processors or threads enter new phases independent of the other processors or threads.

10. The method of claim 1, wherein the system is a multi-processor system having a plurality of processors or a multi-threaded system having a plurality of threads, the monitored variables are collected for each processor or for each thread, and all the processors or all the threads enter new phases as a group.

11. The method of claim 1, wherein dynamically sampling the functional simulation of the system at the intervals comprises dynamically sampling the functional simulation of the system at intervals of simulated execution of a predetermined number of instructions by the system.

12. The method of claim 1, wherein the timing simulation of the system is performed just when the functional simulation has entered into a new phase, as determined by dynamically sampling the functional simulation of the system at the intervals.

13. The method of claim 1, wherein performing both the functional simulation and the timing simulation of the system comprises simulating how the system operates as the functional simulation of the system simulating how much the system takes to perform an intended task as the timing simulation of the system.

14. A method for simulating a computing system, comprising: repeating
advancing a current interval within which the computing system is to be simulated;
where a flag is set to false,
performing functional simulation of the computing system without performing timing simulation of the system for the current interval, by hardware of a computing device;
where the flag is set to true,
performing both the functional simulation and the timing simulation of the computing system for the current interval, by the hardware of the computing device;
setting the flag to false;
where the functional simulation has entered a new phase, as determined by whether a sum of vector norms based on values for a plurality of monitored variables is greater than a threshold,
setting the flag to true;
until simulation of the computing system has been completed, such that the current interval is a last interval, wherein the sum of vector norms is $$\sum_{m=0}^{N} \left\| 1 - \frac{v_{m,t} - v_{m,t-1}}{v_{m,t-1} - v_{m,t-2}} \right\|,$$

where N is equal to a total number of the monitored variables, and where $v_{m,T}$ refers to the value of a given monitored variable m at time T, where T can be equal to a current time t, a time t-1 immediately prior to the current time t, or a time t-2 immediately prior to the time t-1.

15. The method of claim 14, wherein each vector norm is based on the value of a corresponding monitored variable at a current time, the value of the corresponding monitored variable at a first time immediately prior to the current time, and the value of the corresponding monitored variable at a second time immediately prior to the first time.

16. A system to simulate a target system, comprising:
a computer-readable data storage medium storing processor-executable code:
a processor to executing processor-executable code;
a functional simulation component implemented by the processor-executable code to simulate functional operation of the target system, upon execution of the processor-executable code by the processor;
a timing simulation component implemented by the processor-executable code to simulate timing of the target system, upon execution of the processor-executable code by the processor; and,
a monitoring component implemented by the processor-executable code to monitor the functional simulation of the target system as performed by the functional simulation component to determine whether the functional simulation has entered into a new phase, and to cause the timing simulation component to perform timing simulation when the functional simulation of the target system has entered into a new phase, upon execution of the processor-executable code by the processor,
wherein the monitoring component is to determine whether the functional simulation has entered the new phase by determining whether a sum of vector norms based on values for a plurality of monitored variables is greater than a threshold,
and wherein the sum of vector norms is $$\sum_{m=0}^{N} \left\| 1 - \frac{v_{m,t} - v_{m,t-1}}{v_{m,t-1} - v_{m,t-2}} \right\|,$$

where N is equal to a total number of the monitored variables and $\|\cdot\|$ represents a vector norm, and where $v_{m,T}$ refers to the value of a given monitored variable m at time T, where T can be equal to a current time t, a time t-1 immediately prior to the current time t, or a time t-2 immediately prior to the time t-1.

17. The system of claim 16, wherein each vector norm is based on the value of a corresponding monitored variable at a current time, the value of the corresponding monitored variable at a first time immediately prior to the current time, and the value of the corresponding monitored variable at a second time immediately prior to the first time.

* * * * *

UNITED STATES PATENT AND TRADEMARK OFFICE
CERTIFICATE OF CORRECTION

| | |
|---|---|
| PATENT NO. | : 7,912,690 B2 |
| APPLICATION NO. | : 11/740269 |
| DATED | : March 22, 2011 |
| INVENTOR(S) | : Ayose Falcon et al. |

It is certified that error appears in the above-identified patent and that said Letters Patent is hereby corrected as shown below:

In column 9, line 21, in Claim 16, delete "code:" and insert -- code; --, therefor.

In column 9, line 22, in Claim 16, delete "executing" and insert -- execute --, therefor.

Signed and Sealed this
Twenty-fifth Day of October, 2011

David J. Kappos
*Director of the United States Patent and Trademark Office*